United States Patent
Anthony et al.

[11] 3,936,319
[45] Feb. 3, 1976

[54] SOLAR CELL

[75] Inventors: Thomas R. Anthony; Harvey E. Cline; Donald M. Winegar, all of Schenectady, N.Y.

[73] Assignee: General Electric Company, Schenectady, N.Y.

[22] Filed: Oct. 30, 1973

[21] Appl. No.: 411,010

[52] U.S. Cl. .................. 136/89; 148/187; 148/188
[51] Int. Cl. ............................................ H01l 15/02
[58] Field of Search ............. 136/89; 148/33.5, 187, 148/188

[56] References Cited
UNITED STATES PATENTS

| | | | |
|---|---|---|---|
| 2,813,048 | 11/1957 | Pfann | 75/65 ZM |
| 2,875,505 | 3/1959 | Pfann | 136/89 UX |
| 2,919,299 | 12/1959 | Paradise | 136/89 |
| 2,929,006 | 3/1960 | Herlet | 148/188 X |
| 3,015,762 | 1/1962 | Shockley | 148/187 X |
| 3,025,438 | 3/1962 | Wegener | 148/187 X |
| 3,094,634 | 6/1963 | Rappaport | 136/89 UX |
| 3,186,873 | 6/1965 | Dunlap, Jr. | 136/89 |
| 3,615,935 | 10/1971 | O'Keeffe | 148/187 |
| 3,681,154 | 8/1972 | Ashton et al. | 148/187 |
| 3,682,708 | 8/1972 | Bennett | 136/89 |

Primary Examiner—Allen B. Curtis
Attorney, Agent, or Firm—Donald M. Winegar; Joseph T. Cohen; Jerome C. Squillaro

[57] ABSTRACT

A solar cell with improved efficiency is provided with a convoluted P-N junction whereby a higher proportion of carriers produced by exposure of the solar cell to a source of radiation will be collected by the P-N junction rather than being lost by recombination. The solar cell has an increased resistance to radiation damage. The solar cell is made from a body of semiconductor material in which two regions of opposite type conductivity are formed. The material of one region is substantially the same as the body and the material of the other region is recrystallized material of the first region having solid solubility of a metal therein to impart a selective type conductivity and resistivity thereto.

44 Claims, 19 Drawing Figures

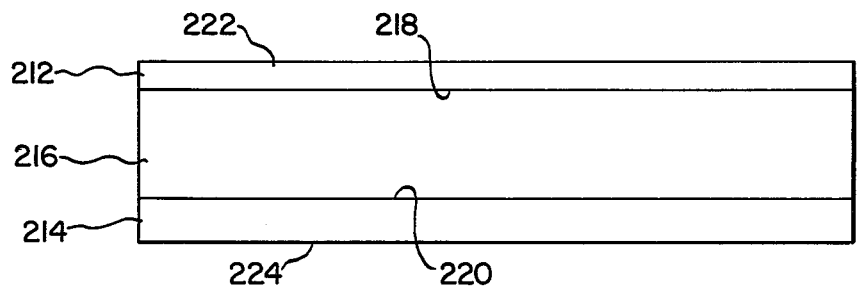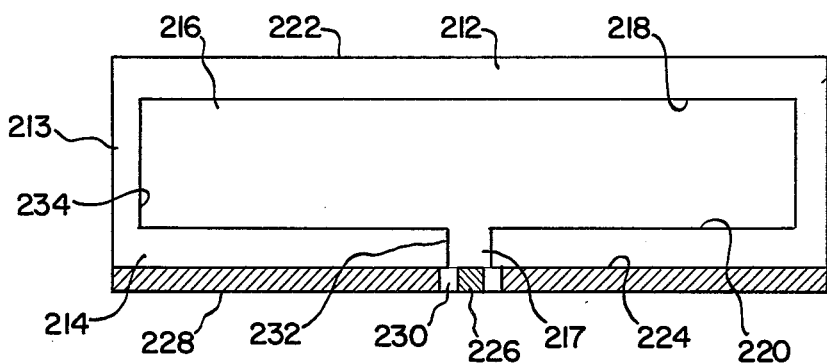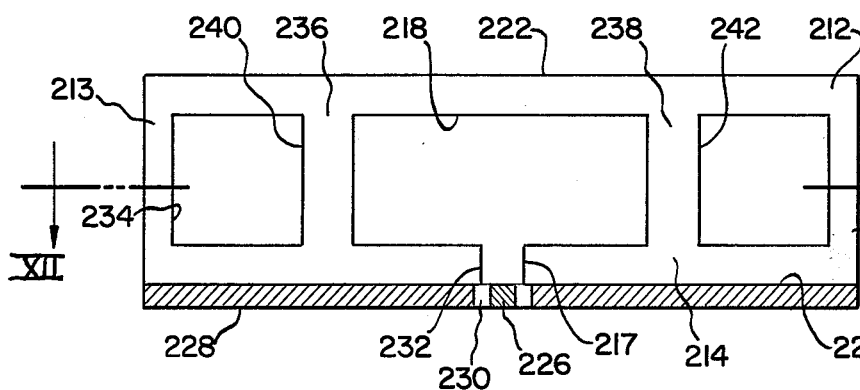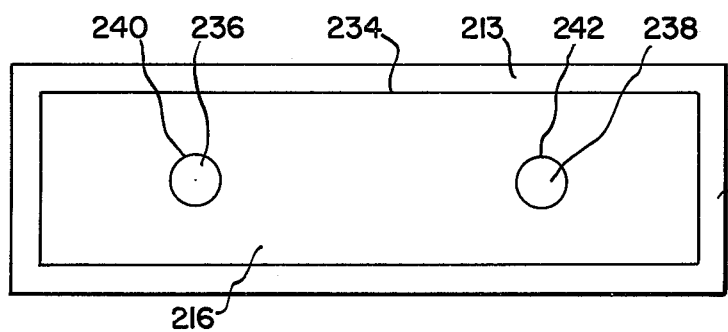

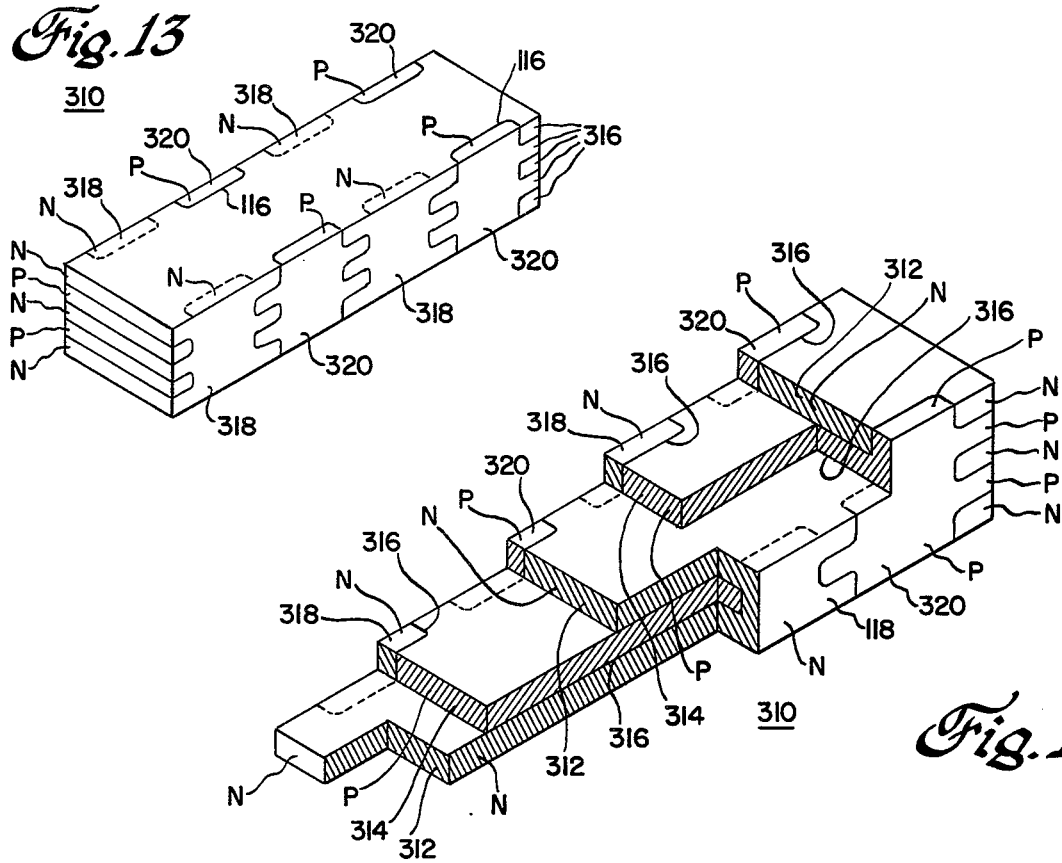
Fig.13
Fig.14
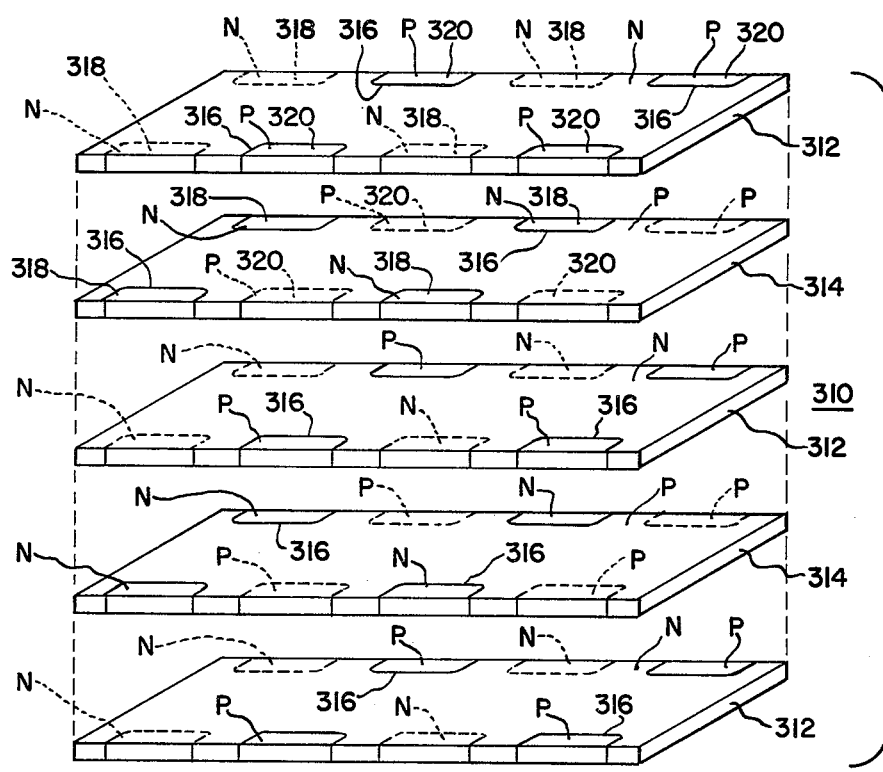
Fig.15

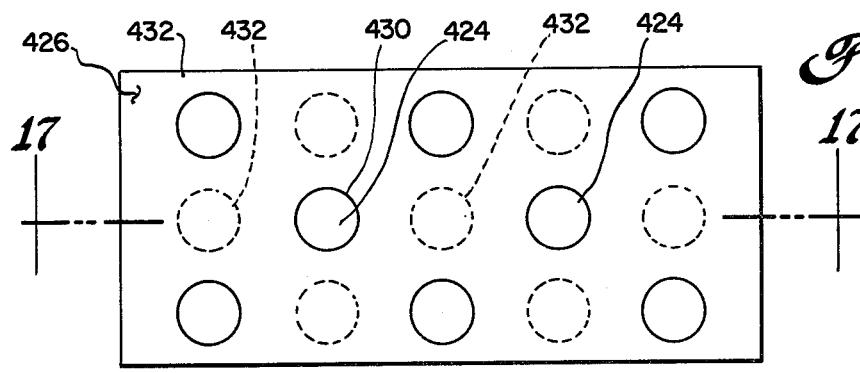
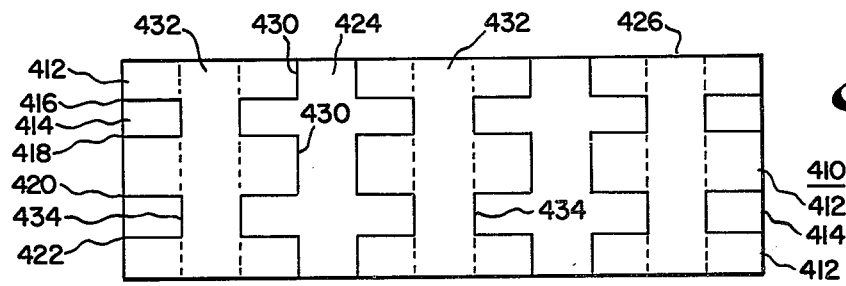
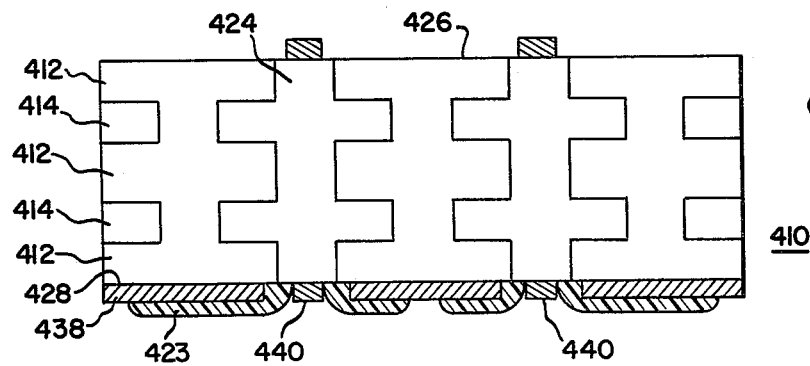
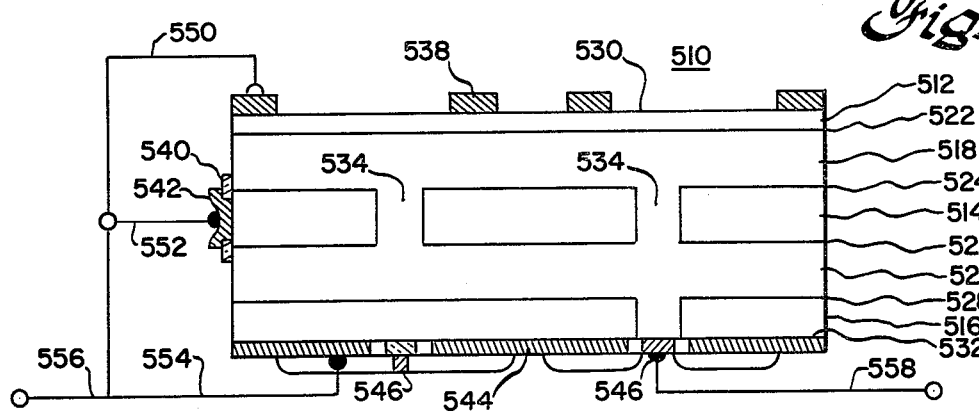

SOLAR CELL

BACKGROUND OF THE INVENTION

1. Field of the Invention

This invention relates to solar cells and particularly to an improved solar cell having essentially a convoluted, single P-N junction providing a plurality of generally parallel P-N junction planes separated by distances of the order of not over one diffusion length whereby carriers generated within the cell are more efficiently collected by the P-N junction of the cell. The P-N junction may be parallel to or perpendicular to the top surface of the cell or a combination of the two.

2. Description of the Prior Art

One of the factors limiting the efficiency of a solar cell is the fraction of photoelectrically produced minority carriers which reach the P-N junction of the solar cell before recombining. Surface and bulk recombination can both play important roles in the recombination of minority carriers generated within the solar cell. Even in the best of present day solar cells, approximately one-quarter to one-third of the generated carriers are lost through recombination.

In an N/P type solar cell, holes produced in the N-region may be lost by recombination in the bulk or at the front surface of the cell. Similarly, electrons produced in the P-region may recombine internally or at the rear surface of the solar cell. In order to minimize recombination in the N-region or at the front surface on which the solar radiation falls, the depth of the P-N junction (actually the N-region thickness) is generally made quite small, of the order of one-half micron. In this instance most photons will pass through this N-layer and be absorbed in the P-region thereby producing hole-electron pairs, with a major portion being generally absorbed in the forward portion of the P-region near the P-N junction. The major contributing cause of low collection efficiency then becomes bulk recombination of the electrons in the P-region, and surface recombination of holes at the electrical contact affixed to the rear of the solar cell. Generally speaking, all carriers generated in the back half of the P-region of the N/P solar cell will be lost by recombination since they are more likely to reach the back surface of the solar cell rather than the P-N junction. Some of these carriers do, however, reach the P-N junction but a corresponding fraction of those produced in the front half of the P-region also reach the back surface of the solar cell, with no net gain in efficiency. Of those carriers generated in the forward portion of the P-region which migrate towards the P-N junction, many are lost by bulk recombination. Fortunately for solar cell efficiency, the exponential absorption of light results in most of the carrier generation occurring near the front of the solar cell.

Carrier collection efficiency is, therefore, a significant problem in solar cell design. To date, approaches to solution of the problem have included making the lifetime, and therefore the diffusion length, for minority carriers in the P-region as high as possible, and/or introducing a graded distribution of impurities into the P-region near the P-N junction, thereby providing a built-in electric field which urges electrons towards the P-N junction. Even with these improvements approximately one-third of the generated carriers in a solar cell are lost through recombination.

A. I. Bennett in his U.S. Pat. No. 3,682,708, proposes a multilayer solar cell having one convoluted P-N junction to improve the efficiency of the cell. The construction of the cell requires numerous epitaxial growth, diffusion and masking processes. Repeated temperature excursions required for the process involved can detrimentally affect the initial substrate material, the epitaxial material subsequentially grown and the electrical characteristics of the numerous P-N junctions which are joined together to make the one convoluted P-N junction. Additionally, the processes involved inherently have a detrimental effect on the P-N junctions formed in that impurities can be trapped at the interfaces of alternate regions of opposite type conductivity and degrade the electrical characteristics of the P-N junction formed thereat.

An object of the invention is to provide a new and improved solar cell which overcomes the deficiencies of the prior art solar cells.

An object of this invention is to provide a solar cell having a P-N junction construction for improving the efficiency of collecting the photoelectrically produced minority carriers.

An object of this invention is to provide a solar cell having an improved resistance to nuclear particle radiation damage.

Another object of this invention is to provide a semiconductor solar cell having a convoluted P-N junction so as to present a plurality of generally parallel P-N junctions contained in the semiconductor body.

A further object of this invention is to provide a solar cell wherein one region is recrystallized semiconductor material having solid solubility of metal therein to impart a selected type conductivity and resistivity thereto.

A still further object of this invention is to provide a solar cell wherein a greater proportion of the P-N junction is perpendicular to the top surface of the solar cell.

Other objects of this invention will, in part, be obvious and will, in part, appear hereinafter.

SUMMARY OF THE INVENTION

In accordance with the teachings of this invention, there is provided a solar cell comprising a body of semiconductor material having two substantially parallel opposed major surfaces, one of the surfaces being exposed to radiation. The material of at least one region is substantially the same as that of the body and the material of the other region is essentially recrystallized material of the body having solid solubility of a metal therein to impart an opposite type conductivity and specific resistivity thereto. P-N junctions formed by mutually adjacent regions of opposite type conductivity are connected together by electrical means to effectively form one convoluted P-N junction. A substantial portion of the convoluted P-N junction comprises a plurality of segments substantially parallel to each other and spaced a predetermined distance from each other. The substantial portion of the convoluted P-N junction is preferably substantially perpendicular to the opposed major surfaces. However, it may also be substantially parallel to the opposed major surfaces of the solar cell. The solar cell may be fabricated by thermal gradient zone melting procedures or by a combination of the same with epitaxial growth techniques.

DESCRIPTION OF THE DRAWINGS

FIGS. 9 through 11 are vertical cross-sectional views of a solar cell being processed in accordance with the teachings of this invention;

FIG. 12 is a cross-section of the solar cell of FIG. 4 taken along the cutting plane XII—XII;

FIG. 13 is an isometric view of a solar cell made in accordance with the teachings of this invention;

FIG. 14 is an isometric view, partly in cross-section, of the solar cell of FIG. 13;

FIG. 15 is an exploded view of the solar cell of FIG. 13;

FIG. 16 is a top planar view of another embodiment of a solar cell made in accordance with the teachings of this invention;

FIG. 17 is a vertical cross-sectional view of the solar cell of FIG. 16 taken along the cutting plane XVII—XVII;

FIG. 18 is an elevation view, in cross-section, of the completed solar cell of FIG. 17 illustrating the ohmic contacts affixed thereto; and FIG. 19 is an elevation view, in cross-section of another alternate embodiment of a solar cell.

DESCRIPTION OF THE INVENTION

Figure 1:
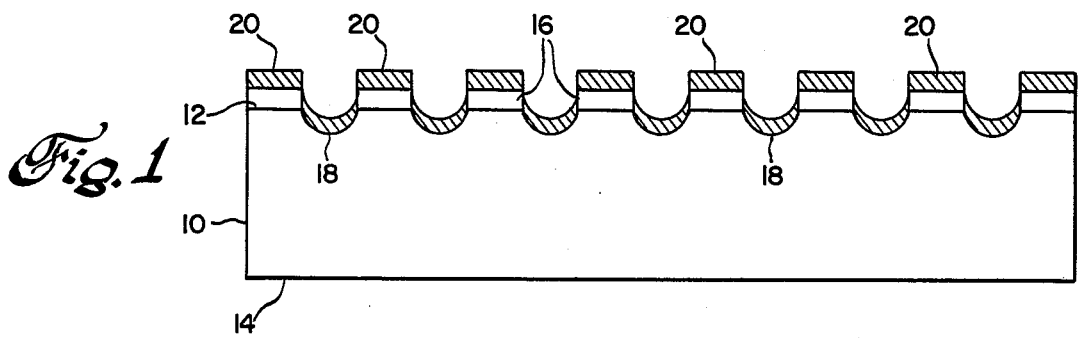
FIGS. 1, 2 and 3 are elevation views, in cross-section, of a body of semiconductor material processed in accordance with the teachings of this invention.

With reference to FIG. 1, there is shown a body 10 of semiconductor material having a selected resistivity and a first type conductivity. The body may be a wafer of suitably doped semiconductor material or an elongated strip or flat body of semiconductor material such, for example, as webbed dendritic material such as disclosed in U.S. Pat. Nos. 3,129,061 and 3,162,507. The body 10 has opposed major surfaces 12 and 14 which are substantially parallel to each other and are the top and bottom surfaces respectively thereof. The semiconductor material comprising the body 10 may be silicon, germanium, silicon carbide, gallium arsenide, a compound of a Group II element and a Group VI element and a compound of a Group III and a Group V element. In order to describe the invention more fully, the body 10 will be described as being of silicon semiconductor material.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 14 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80°C. A suitable mask of spaced lines of a predetermined thickness and spaced a predetermimed distance apart is disposed on the layer of photoresist and exposed to ultraviolet light. Preferably the spacing between the lines and the thickness of the lines is less than the diffusion length of the minority carrier generated within the completed solar cell where it is exposed to solar radiation. After exposure, the layer of photoresist is washed in Xylene to open windows in the mask where the lines are desired so as to be able to selectively etch the silicon dioxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180°C or immersion in a solution of 1 part of hydrogen peroxide and 1 part of concentrated sulphuric acid immediately after mixing.

Selective etching of the exposed surface areas of body 10 is accomplished with a mixed acid solution. The mixed acid solution is 10 parts by volume nitric acid, 100%, 4 parts by volume acetic acid, 100%, and 1 part by volume hydrofluoric acid, 48%. At a temperature of from 20°C to 30°C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25°C will result in a trough 18 of from 25 to 30 microns in depth for a window width of from 10 to 500 microns. The etched body 10 is rinsed in distilled water and blown dry. Preferably a gas such, for example, as freon, argon and the like is suitable for drying the processed body 10.

The processed body 10 is disposed in a metal evaporation chamber. A metal layer 20 is deposited on remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the material of the body 10 through which it migrates. The thickness of the layer 20 is approximately equal to the depth of the troughs 18. Therefore if the troughs 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper, selective etching and the like.

It has been discovered that the vapor deposition of the layer 20 of aluminum metal should be performed at a pressure of approximately $1 \times 10^{-5}$ torr but not less than $3 \times 10^{-5}$ torr. When the pressure is greater than $3 \times 10^{-5}$ torr, we have found that in the case of aluminum metal deposited in the troughs 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as it appears to be saturated with oxygen from the process. The preferred methods of depositing aluminum on the silicon body 10 are by the electron beam method and the like wherein little if any oxygen can be trapped in the aluminum.

The processed body 10 is placed in a thermomigration apparatus, not shown, and the metal wires in the troughs 18 are migrated through the body 10 by a thermal gradient zone melting process. A thermal gradient of approximately 50°C per centimeter between the bottom surface 14, which is the hot face, and the surface 12, which is the cold face, has been discovered to be appropriate for an average temperature of the body 10 from 700°C to 1350°C. The process is practiced for a sufficient length of time to migrate all the metal wires through the body 10. For example, for aluminum wires of 20 microns thickness, a thermal gradient of 50°C/cm, a pressure of $1 \times 10^{-5}$ torr, a furnace time of less than 12 hours is required to migrate the wires through a silicon body 10 of 1 centimeter thickness.

The temperature gradient zone melting process and apparatus for the practicing of the same is not a part of this invention. For a more thorough understanding of the temperature gradient zone melting process employed in this invention and for a more thorough description of the apparatus employed for practicing the process, one is directed to the following copending applications filed concurrently with this patent application and assigned to the same assignee of this invention: Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008.

The invention has been described relative to practicing thermal gradient zone melting in a negative atmosphere. However, it has been discovered that the thermal gradient zone melting process may be practiced in an inert atmosphere of a suitable gas such as, for example, as hydrogen, helium, argon and the like in a furnace having a positive atmosphere. A wafer of a thickness of the order of 10 mils may be processed in a positive inert atmosphere without the protection of thermal gradient guards about the outer periphery. The thinness of the wafer apparently makes any lateral thermal gradient experienced substantially ineffective in altering the desired vertical thermomigration of metal wires and droplets.

The thermomigration of metal wires is preferably practiced in accordance with the planar orientations, thermomigration directions, stable wire directions and stable wire sizes of Table I.

Table I

| Wafer Plane | Migration Direction | Stable Wire Directions | Stable Wire Sizes |
|---|---|---|---|
| (100) | <100> | <011>* | <100 microns |
|  |  | <0$\bar{1}$1>* | <100 microns |
| (110) | <110> | <1$\bar{1}$0>* | <150 microns |
| (111) | <111> | a) <01$\bar{1}$> |  |
|  |  | <10$\bar{1}$> | <500 microns |
|  |  | <1$\bar{1}$0> |  |
|  |  | b) <11$\bar{2}$>* |  |
|  |  | <$\bar{2}$11>* | <500 microns |
|  |  | <1$\bar{2}$1>* |  |
|  |  | c) Any other* Direction in (111) plane* | <500 microns |

*The stability of the migrating wire is sensitive to the alignment of the thermal gradient with the <100>, <110> and <111> axis, respectively.
+Group a is more stable than group b which is more stable than group c.

For a discussion of the preferred orientation of the crystal lattice of the semiconductor material for the depositing of metal "wires" thereon and the migration of the same one is directed to the copending application entitled Thermomigration of Metal-Rich Liquid Wires Through Semiconductor Materials, Ser. No. 411,018, also filed concurrently with this application and assigned to the same assignee of this invention.

Figure 2:
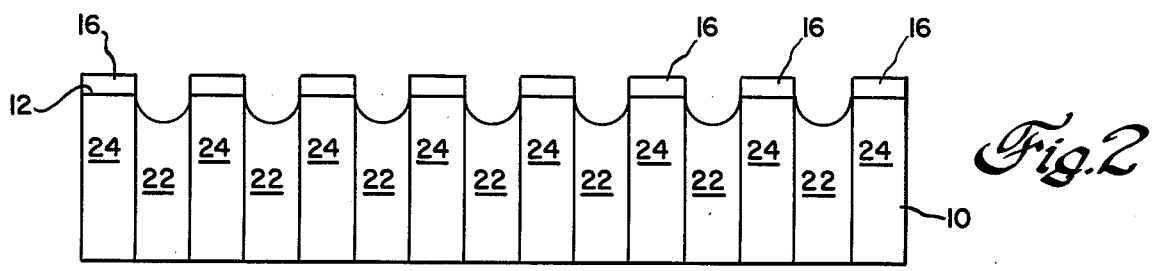

Upon completion of the temperature gradient zone melting process the resulting processed body 10 is as shown in FIG. 2. The thermal migration of the metal wires in the troughs 18 through the body 10 produces a lamellar body 10 having a plurality of first spaced regions 22 of a second and opposite type conductivity than that of the body 10. Each region 22 is recrystallized material of the body 10 having solid solubility of a dopant material which comprises the metal wire and imparts the desired type conductivity to the regions 22. Each region 22 is heavily doped and has low resistance which is desirable for solar cells. The region 22 has a substantially constant uniform level of impurity concentration throughout the entire planar region. This occurs because the slope of the solid solubility curve of aluminum within the process temperature range is small. The thickness of the region 22 is substantially constant for the entire region. The peripheral surface of each planar region 22 comprises in part the top surface 12, the bottom surface 14 and the peripheral side surface of the body 10. In addition, the total area of the surface 12 which is devoted to P-type region 22 should be minimized as much as possible to enable as much N-type material as possible to be exposed to radiation.

Additionally, the body 10 is divided into a plurality of spaced regions 24 having the same, or first, type conductivity, as the body 10. A P-N junction 26 is formed by the contiguous surfaces of each pair of mutually adjacent regions 22 and 24 of opposite type conductivity. The P-N junction 26, as formed, is very abrupt and distinct resulting in a stepped junction. Each P-N junction is approximately 0.3 to 18 microns in width for the process temperature range.

Figure 3:
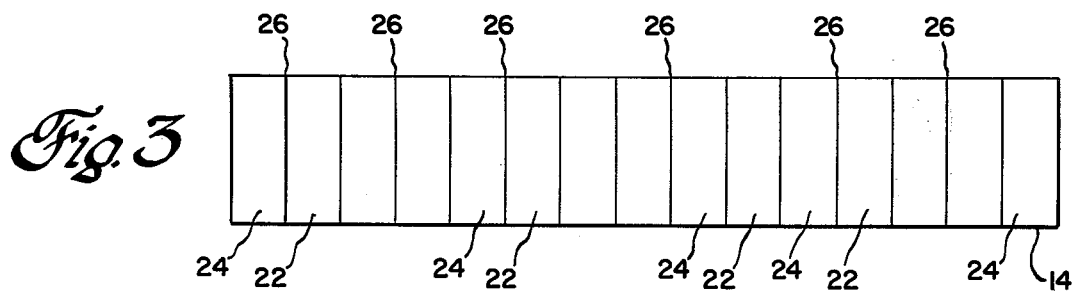

The resulting structure is one large area multiple planar regions of alternative type conductivity as shown in FIG. 3. The structure may also be divided into a plurality of chips having a similar configuration.

Should the body 10 be of material which is not heavily doped and therefore having a higher electrical resistance then deemed desirable, a second temperature gradient zone melting (TGZM) process may be practiced. In the second TGZM process the metal "wires" which are migrated through the body overlap the aluminum enriched regions to preserve the step junction. However, a post TGZM heat treatment may be practiced to achieve lateral diffusion of the P-N junctions 26 and a graded structure thereof to accelerate the diffusion of generated carriers to a P-N junction and be collected thereby.

When radiation impinges upon the upper surface 12 of the solar cell and penetrates into the plurality of regions 22 and 24, photons are absorbed in the structure of the solar cell. Hole electron pairs result from the absorption of the photons and minority carriers produced anywhere within the body 10 will have only a short distance to diffuse to be collected by a P-N junction 26. The short diffusion distance to a P-N junction 26 is due to each region 22 and 24 being less than one diffusion length. The collection efficiency of the solar cell of this invention is an improvement over prior art solar cells, including that of Allan I. Bennett, as a result of the unique cell structure and either one or both of the regions 22 and 24 being of recrystallized semiconductor material, having a substantially uniform level of concentration of dopant impurity throughout the respective region and each region being of approximately the most highly doped material obtainable.

Figure 4:
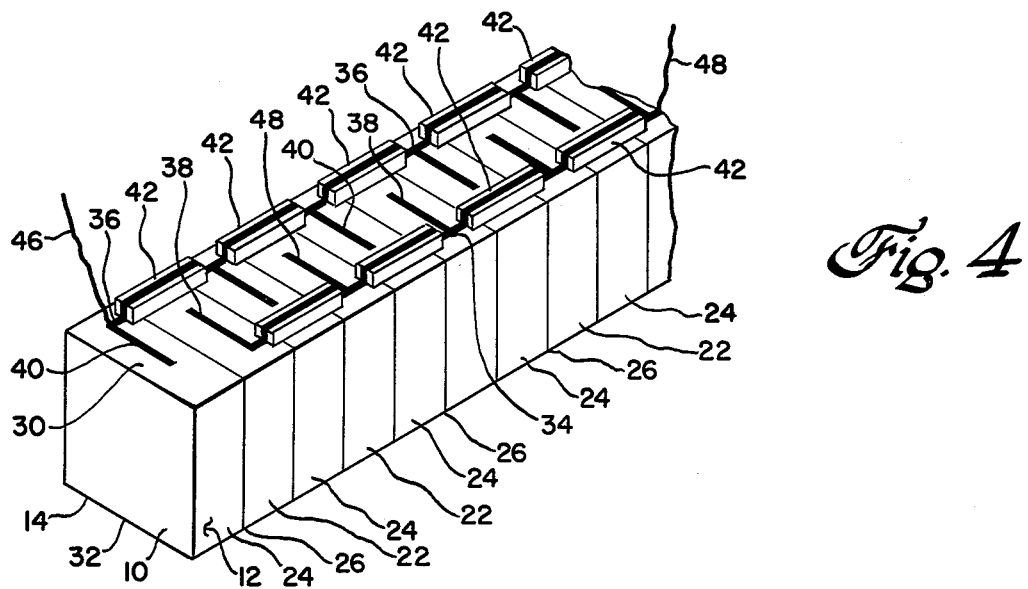
FIG. 4 is an isometric view of a solar cell made in accordance with the teachings of this invention.

Electrical contacts for collecting the carriers which are collected by the P-N junction 26 are kept clear of the top surface 12. It is desirable to keep the top surface 12 clear of ohmic electrical contacts in order that the surface 12 may have as great a photon-penetrable area exposed to the impinging radiant energy source as is possible. Therefore, ohmic electrical contacts are preferably disposed on respective regions 22 and 24 in any of the side surfaces 30 and 32 and the bottom surface 14 of the body 10 to electrically connect the solar cell to electrical circuitry external to the cell. Referring now to FIG. 4, a typical electrical contact arrangement for the solar cell of this invention is shown disposed on the surface 30. Ohmic electrical contacts 34 and 36 are shown disposed on, and in an electrical conductive relationship with the respective regions 22 and 24. The contacts 34 and 36 effectively connect the plurality of P-N junctions 26 into one P-N junction. Preferably, each contact 34 and 36 has a comb-like structure having integral contact members 38 and 40 respectively which permit greater electrical contacting of the respective regions 22 and 24. A layer 42 of an electrical insulating material such, for example, as silicon oxide, silicon nitride and the like permits bridging by contact 34 and 36 of regions of opposite type conductivity and P-N junctions 26 associated therewith. Electrical leads 44 and 46 are affixed to respective contacts 34 and 36 for electrically connecting the solar cell to the electrical circuitry external to the cell.

Figure 5:
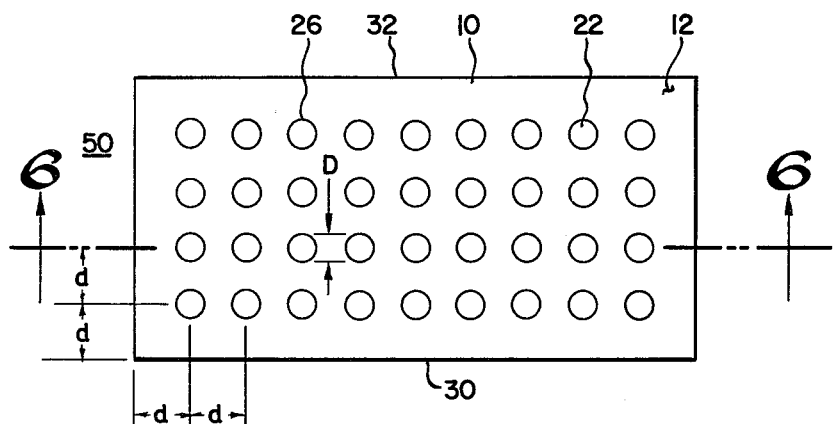
FIG. 5 is a top planar view of another embodiment of a solar cell made in accordance with the teachings of this invention.
Figure 6:
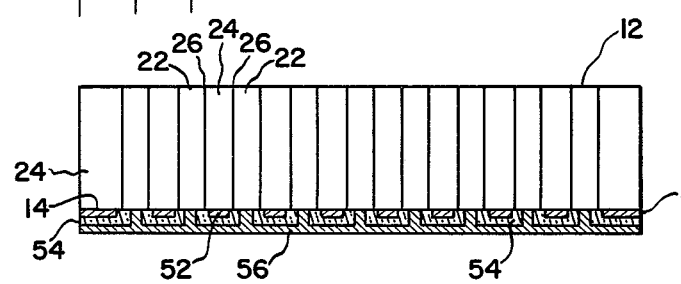
FIG. 6 is an elevation view, in cross-section, of the solar cell of FIG. 5 taken along the cutting plane VI—VI.

With reference to FIGS. 5 and 6, there is shown a solar cell 50 which is an alternate embodiment of the solar cell of FIG. 4. The reference numerals which are the same as those in FIG. 4 denote items which are the same, and function in the same manner, as those items in FIG. 4. The solar cell structure differs in that the regions 22 are a columnar array of rods of recrystallized material having solid solubility of metal therein to impart the type conductivity and resistivity thereto.

The regions 22 are preferably formed by the thermomigration of metal droplets through the body 10. It has been discovered that when the body 10 is of silicon, germanium, silicon carbide, gallium arsenide semiconductor material and the like, the migrating metal droplet has a preferred shape which also gives use to the region 22 being of the same shape as the migrating droplet. In a crystal axis direction of <111> of thermal migration, the droplet migrates as a triangular platelet laying in a (111) plane. The platelet is bounded on its edges by (112) planes. A droplet larger than 0.10 centimeter on an edge is unstable and breaks up into several droplets during migration. A droplet less than 0.0175 centimeter does not migrate into the body 10 because of a surface barrier problem.

The ratio of the droplet migration rate over the imposed thermal gradient is a function of the temperature at which thermomigration of the droplet is practiced. At high temperatures, of the order of from 1,100°C to 1,400°C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is increased by a factor of 200.

A droplet thermomigrates in the <100> crystal axis direction as a pyramidal bounded by four forward (111) planes and a rear (100) plane. Careful control of the thermal gradient and migration rate is a necessity. Otherwise, a twisted region 22 may result. It appears that there is a non-uniform dissolution of the four forward (111) facets in that they do not always dissolved at a uniform rate. Non-uniform dissolution of the four forward (111) facets may cause the regular pyramidal shape of the droplet to become distorted into a trapezoidal shape.

The preferred distance $d$ between the center line of the rows and columns of the regions 22 and the preferred diameter D of each region 22 is less than one diffusion length of the minority carriers generated within the cell 50. Ohmic electrical contact 52 is affixed to the region 24 at the bottom surface 14 of the body 10. A layer 54 of an electrical insulating material such, for example, as silicon oxide, silicon nitride and the like is disposed on the contact 52, each of the P-N junctions 26 exposed in the bottom surface 14 and a selected portion of the regions 22 and 24 adjacent the respective P-N junctions 26. An ohmic electrical contact 56 is disposed on the layer 52 and is affixed to the regions 22.

Figure 7:
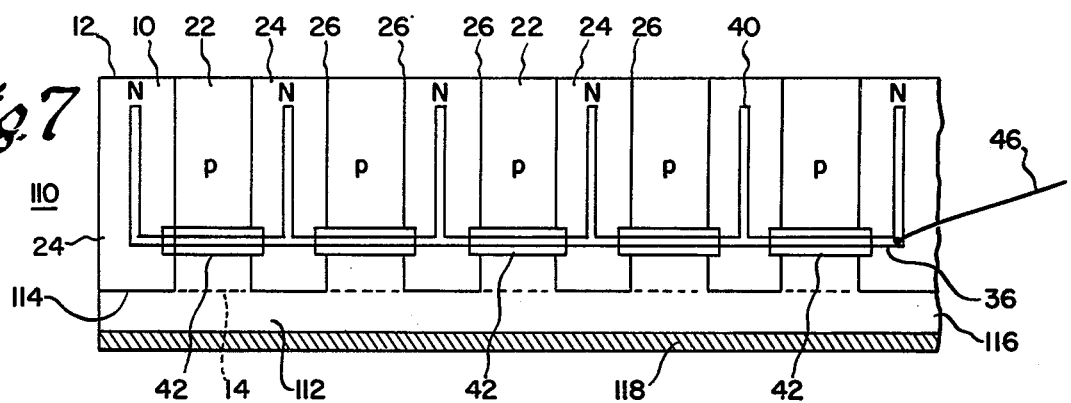
FIGS. 7 and 8 are elevation views, partly in cross-section, of other embodiments of solar cells made in accordance with the teachings of this invention.

Referring now to FIG. 7, there is shown a solar cell 110 which is an alternate embodiment of the solar cell of FIG. 4. All items denoted by the same reference numerals as those used in conjunction with FIG. 4 are the same, and function in the same manner, as the item in the solar cell of FIG. 4. Upon completion of the thermal gradient zone melting process to form the regions 22 and 24 of the cell 110. Thereafter a region 116 is formed by a layer 112 of semiconductor material of the same type conductively as the regions 22 and heavily doped so as to have substantially the same resistivity as the regions 22 which is epitaxially grown on the bottom surface 14 of the body 10. The region 116 is less than one diffusion length in thickness of the minority carriers generated in the cell 110 or about 0.3 to 0.5 micron. A plurality of P-N junctions 114 are formed by the contiguous surfaces of the regions 24 and 116 of opposite type conductivity. Each P-N junction 114 is integral with at least one P-N junction 26. The P-N junctions 114 are substantially parallel to the surface 12 of the body 10 and substantially perpendicular to the one or more respective integral P-N junctions 26. Ohmic electrical contact 118 is affixed to the region 116. Again the arrangement of the electrical contacts 36 and 118 effectively join the plurality of P-N junctions 26 and 114 into one P-N junction.

Figure 8:
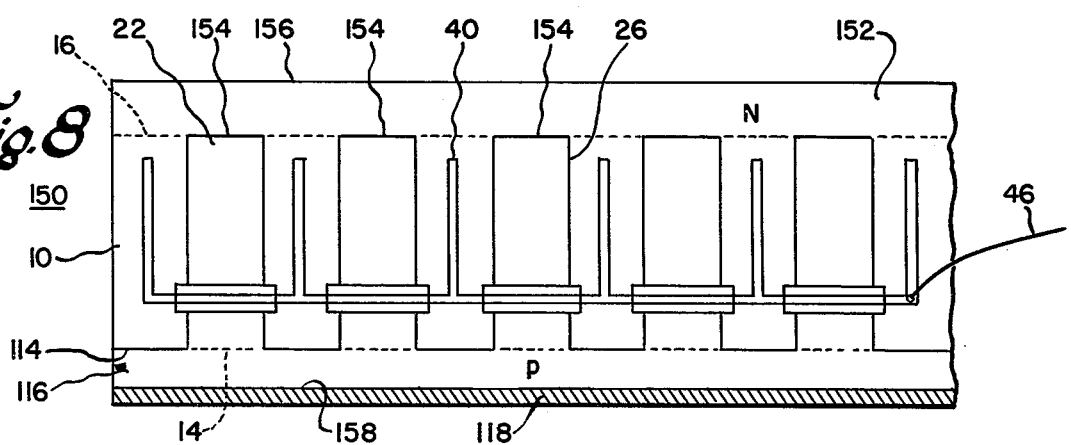

With reference to FIG. 8, there is shown a solar cell 150 which is an alternate embodiment of the solar cell 110. All items denoted by the same reference numerals are the same, and function in the same manner, as those items of solar cell 110. A region 152 of sremiconductor material is epitaxially grown on the top surface 12 of the body 10. The region 152 has the same conductivity as the regions 24 and forms a P-N junction 154 with each region 24 of opposite type conductivity. The plurality of P-N junctions 154 are substantially parallel to the top and bottom surfaces 156 and 158 of the solar cell and the plurality of P-N junctions 114 and substantially perpendicular to the one or more P-N junctions 26 with which it is integral. P-N junctions 26, 114 and 154 form one convoluted P-N junction in the solar cell 150. The thickness of the region 152 is very thin, preferably 0.3 to 0.5 micron. This preferred thickness minimizes light absorption and carrier generation in the region 152. This region 152 is exposed to the source of radiation and more than one-half of the carriers generated by the light photons in the region 152 are lost by recombination at the surface 156. The material of the region 152 is heavily doped to reduce the resistivity of the region 152 and therefore lower the cell series resistance.

Alternatively, the regions 116 and 152 are epitaxially grown on the respective surfaces 14 and 16 of the body 10 and the regions 22 are formed thereafter. The regions 22 are formed by the thermal gradient zone melting process embodying droplets and metal wires wherein the thermomigration is practiced from surface 158 to predetermined distance into the body 10 and then reversed to withdraw the metal to achieve substantially the same structure as that as shown in FIG. 8.

Referring now to FIG. 9, there is shown a solar cell 210 comprising two regions or layers 212 and 214 of N-type semiconductivity and one intermediate layer or region 216 of P-type semiconductivity. Three or a higher odd number of N-type layers can be employed with a P-type layer between each two successive N-type layers. Essentially parallel P-N junctions 218 and 220 are present between respective adjoining contiguous layers or regions 216 and 212 and 216 and 214. The cell 210 has substantially flat, parallel top and bottom surfaces 222 and 224, respectively. As compared to a conventional photocell with a single N-type surface layer and a single P-type back layer, a photocell with three N-type layers and two interposed P-type layers should have a substantial increase, in the order of 20% to 25%, in collection efficiency.

The uppermost layer 212, which is exposed to the impinging source of radiation, is very thin, its thickness being preferably from 0.3 micron to 0.5 micron. This thinness minimizes light absorption and carrier generation in the layer 212. Since it is the exposed region, more than one-half of the carriers generated by the light photons in this layer 212 are lost by recombination at the surface 222. The semiconductor material of the layer 212 is heavily doped to reduce the resistivity of the region and therefore lower the cell series resistance.

The layers 214 and 216 each have a preferred thickness of less than the diffusion length of the minority carriers generated within the cell 210 when it is activated by exposure to solar radiation. Should the layers 212 and 214 be epitaxially grown or formed as a result of the migration of metal wires by the temperature gradient zone melting process to form either one or both of the layers, then the thickness and impurity concentration of each of these layers can be independently controlled. In particular, the layer 216 is formed by the migration of metal wires through a body of semiconductor material by the thermal gradient zone melting process thereby producing a solar cell similar in configuration to that of FIG. 1. The layer 214 need not be of the same level of impurity concentration as the layer 212. Since the layer 214 is not exposed directly to the impinging radiant source of energy, the layer 214 can therefore have a lower level of impurity concentration than the layer 212. The layer 214 may also be greater in thickness than the layer 212 provided it does not exceed the preferred thickness equal to approximately the diffusion length of the minority carriers generated within layer 214 of the cell 210. The layer 214 is preferably thicker than the layer 212, but is thinner than the layer 216. The preferred thickness of the layer 214 is to minimize carrier loss since many of the carriers can be lost at the surface 224 by recombination.

When light impinges on the upper surface 222 and penetrates into and through layer 212, photons are absorbed in the structure of the solar cell 210 whereby hole-electrons pairs result and minority carriers produced anywhere within the body of cell 210 will have only a short distance to diffuse to reach one of the P-N junctions 218 and 220 and be collected. Since the layers 212, 214 and 216 each have a thickness of less than the diffusion length of the carrier generated, generated carriers will be much more likely to reach the junctions 218 and 220 than to recombine and thereby the collection efficiency of cell 210 is improved over that of conventional two-region solar cells of the prior art devices.

It is desirable to keep the top surface 222 of the solar cell 210 clear of any ohmic electrical contacts in order that the surface 222 may have as great a photon-penetrable area exposed to the impinging radiant energy source as is possible. Electrical contacts can be affixed to the end surfaces of the layers 212, 214 and 216. However, the carriers collected in the areas of the respective layers a considerable distance from the contacts must travel laterally a relatively long distance within the layer before reaching the ohmic contacts of each layer. The electrical resistivity of the layers 212, 214 and 216, particularly of 212, is relatively high so that this electrical current flowing laterally to the electrical contacts on the side surface encounters a high cell series resistance. Therefore, the electrical contacts to the layers 212, 214 and 216 are all made from the surface 224 which is the opposed surface to surface 222 which is exposed to the source of radiant energy, in a manner described in the succeeding paragraphs.

The structure of the solar cell 210 can be made from wafers of suitably doped semiconductor material such, for example, as silicon. Top and bottom layers 212 and 214 of N-type semiconductor material are formed, by the migration of aluminum "wires" through the wafer by the temperature gradient zone melting (TGZM) process. Thereafter, as shown in FIG. 10, a sufficient area of the layer 216 is made available such, for example, as by diffusion or TGZM to form one or more rod-like regions 217 through region 214 from the bottom surface 224 to region 216 to provide for a good ohmic electric contact 226 to be applied to the region 217 and hence to the region 216. An ohmic electrical contact 228 is affixed to the layer 214. The contacts 226 and 228 are separated from each other by an isolation groove 230 which prevents an electrical short circuit from occurring between the contacts 226 and 228 and prevents either of the contacts 226 and 228 from electrically short-circuiting a P-N junction 232 formed by the contiguous surfaces of the P-type and N-type semiconductor materials. The P-N junction 232 is exposed in, and extends from, the surface 224 to intersect, and electrically connect with, the P-N junction 220.

The layer 212 may be electrically connected to the contact 228 by suitable means such, for example, as by diffusing of an N-type dopant into the side surfaces of the material comprising the solar cell 210 or by the migration of the aluminum "wires" by the TGZM process through only a selected portion of the N-type material. The diffusion or TGZM process may be accomplished simultaneously when the layers 212 and 214 are formed. In either case, the layers 212 and 214 are joined together electrically by a region 213 of like semiconductivity and a P-N junction 234 intersecting and electrically connecting together the P-N junctions 218 and 220. Being electrically joined together the P-N junctions 218, 220, 232 and 234 form one convoluted P-N junction being essentially parallel to both the top surface 222 and the bottom surface 224. The multi-layer solar cell is therefore now, for all intents and purposes, a two region solar cell having higher efficiency than prior art two region solar cells.

As shown, the regions 213 and 217 enable one to eliminate the need for any electrical contact being disposed on the top surface 222 therefore making the entire area of the surface 222 an active surface area for the cell 210. The layer 216 of P-type semiconductor material is at least thick enough to trap nearly all of the photons impinging on the solar cell 210, and it is approximately two diffusion lengths in thickness. The layer 212 is from 0.3 micron to 0.5 micron in thickness. The layer 214 need not be of the same uniform impurity concentration throughout and need not have the same thickness as the layer 212. The thickness of layer 214, like that of layer 212, is a compromise between requirements of low generated-carrier recombination loss and low cell series resistance. But, since the photons are mostly absorbed before reaching layer 214, the generated-carrier density is much less there than in layer 212. Therefore, the thickness of layer 214 is much less critical than that of layer 212, although optimally it should still be considerably less than a diffusion length, probably in the range of 3 to 10 microns.

Should the edge or side region 213 fail to achieve a sufficient low resistance path between layers 212 and 214, other low resistance paths may be formed between the layers 212 and 214 as shown in FIGS. 11 and 12.

With reference to FIGS. 11 and 12, the layers 212 and 214 are connected electrically by centrally disposed low resistance rod-like regions 36 and 38 formed between the aforementioned layers by temperature gradient zone melting (TGZM). As shown in FIG. 12, during the process which produced region 213 there also are produced several centrally located regions 236 and 238 of N-type semiconductivity each of which also forms a low resistance electrical connection between layer 212 and 214. Alternatively, a separate TGZM process is employed to migrate suitably doped metal "wires" or droplets to form the N-type regions 236 and 238 after the formation of the P-type regions 216. P-N junctions 240 and 242 are formed between each of the respective regions 236 and 238, and the layer 216 of P-type material, the P-N junctions 218, 220, 232, 234, 240 and 242 all being physically and electrically connected together to form one convoluted P-N junction within the cell 210, whereby photons of radiated energy impinging on surface 222 will pass through two parallel portions of the convoluted P-N junction in reaching the back surface 224.

The number of layers of semiconductor material of opposite type semiconductivity alternately disposed in contact with each other and substantially parallel to the top surface of a solar cell constructed in accordance with the teachings of this invention need not be restricted to only three layers as shown, but may also be made with four or more layers of semiconductor material.

Employing the teachings of this invention as presented herein, there is shown in FIGS. 13, 14 and 15 a solar cell 310 which is an embodiment having some advantages over the solar cell 210 described heretofore. Generally, this improved solar cell 310 comprises an N-region and a P-region interconvoluted or interconnected so as to present to a passing photon of light a plurality of substantially parallel alternately and successively disposed N-type and P-type layers of semiconductor material. Each of the layers has a preferred thickness of less than the diffusion length of the minority carriers generated within the cell when it is activated to exposure to solar radiation. The top layer is very thin, preferably from 0.3 to 0.5 micron in thickness, and has a high level of impurity concentration to reduce the electrical resistance within the layer. The bottom layer may be of the same thickness and doping concentration as the top layer, though as heretofore described it may have a thickness greater than that of the top layer but less than that of the intermediate layers. For some purposes the bottom layer may also have a level of doping impurity concentration less than that of the top layer. When initially prepared, a P-N junction 316 exists as several separate P-N junctions formed by the contiguous surfaces of the adjacent layers 312 and 314 of different type semiconductivity. Employing the thermomigration of metal wires enriched in either N-type or P-type dopant impurity as required by the temperature gradient zone melting (TGZM) process, N-type regions 318 and P-type regions 320 are produced in any suitable arrangement about the sides and ends of the cell 310. The N-type regions 318 connect the N-type layers 312 together and the P-type regions 320 connect the P-type layers together whereby only common regions 312 and 314 exist. Each contiguous surface of each region 318 with a layer 314 forms a P-N junction which is a segment of the convoluted P-N junction 316. In the same manner, each contiguous surface of region 320 and a layer 312 forms a P-N junction which is a segment of the convoluted P-N junction 316. The exploded view in FIG. 15 illustrates how the cell 310 comprises basically five parallel flat integral layers or plates. Each layer or plate has at its sides or edges regions 118 and 120 formed by either TGZM or by diffusion. The contiguous surfaces of the opposite type semiconductor material form P-N junctions which are small segments of the complete P-N junction 316, whereas the contiguous surfaces of the flat contacting surfaces of layers 312 and 314 are the major P-N junction When of the convoluted junction 316. Whenn all the plates or layers 312 and 314 of FIG. 15 are stacked together all the segments of the convoluted P-N junctions 316 are physically connected together to form one continuous common P-N junction. FIG. 14 illustrates in perspective and section both the horizontal and the vertical physical connecting of all the segments of the junction 316. Appropriate ohmic electrical connections can be made to the regions of opposite type conductivity to make the cell 310 operative as a source of electrical energy when irradiated.

As previously prescribed heretofore, the external top layer 312 is preferably from 0.3 micron to 0.5 micron in thickness. All the other layers, 312 and 314 are preferably less than one diffusion length in thickness of the minority carriers generated in the cell. However, as discussed previously, the bottom layer 312 may be thicker than the front layer and have a lesser impurity concentration than the top external layer.

Ohmic electrical contacts may be affixed to the bottom of the solar cell 310 following the technique employed in applying contacts 226 and 228 in fabricating the solar cell 210.

Referring to FIGS. 16, 17 and 18, there is shown another form of solar cell 410 in accordance with the invention, comprising a plurality of substantially parallel layers 412 of N-type semiconductivity material and a plurality of substantially parallel layers 414 of P-type semiconductor material. Any or all of the layers or regions 412 and 414 are formed by the temperature gradient zone melting (TGZM) process. Preferably, at least the regions 414 are formed by TGZM by migrating aluminum "wires" in N-type silicon semiconductor material. The contiguous surfaces of opposite type semiconductivity form P-N junctions 416, 418, 420 and 422. The alternately disposed layers 412 and 414 form a solar cell 410 of N-P-N-P-N configuration. The front layer 412 is of approximately the same thickness as the top layer previously described, from 0.3 micron to 0.5 micron. The thinness of this surface layer 412 minimizes light absorption and carrier generation in this surface layer 412 since many of these carriers can be readily lost by surface or bulk recombination.

A plurality of rod-like P-type semiconductivity regions 424 are formed in the structure of the solar cell 410 by the TGZM process from either one of the opposite surfaces 426 and 428, from the sides, or the ends of the structure thereby forming P-N junctions 430 where the surface is contiguous with an N-type region 412. Similarly, a plurality of rod-like N-type semiconductivity regions 432 are formed in the P-type regions 414 of the cell 410 foor interconnecting the top, bottom and middle layers of the N-type layers 412 and forming P-N junctions 434 when a surface of any of the regions 412 is contiguous with a P-type region 414. These rod-like regions 424 and 432 provide a ready means whereby the P-N junctions formed by the contiguous surfaces of regions of opposite type semiconductivity are connected together both physically and electrically to form one contiguous P-N junction having a convoluted shape. Thus a photon of light can penetrate through a series of parallel P-N junctions and when it finally generates a minority carrier anywhere in the cell 410, such carrier is so near a P-N junction that it is highly likely to reach such junction, and very few carriers are lost through recombination.

The ohmic electrical connections to the solar cell 410 may be made by any of the methods described heretofore for any of the previous solar cells and particularly with reference to the solar cell 50 as depicted in, and described with reference to, FIGS. 5 and 6. Referring to FIG. 18, there is shown a method of affixing electrical connections to the cell 410 whereby a large area electrical contact 438 and a layer 423 of electrically insulating material as required, affixed to the surface 428 is employed to provide an external electrical contact to the region 412 of cell 410. Electrical contacts 440 electrically insulated from the contact layer 438 are affixed to the P-type regions of the cell 410 in the same manner as the electrical contacts 26 and 28 of the solar cell 10 as shown in FIGS. 6 and 11.

Although all solar cell examples described herein have been described as having three or five contiguous layers, or regions, of opposite type semiconductor material, any number either even or odd of layers or regions, may be employed so long as one can efficiently collect the majority of carriers generated by the radiation source impinging on the active surface area of the cells. Preferably, the surface layer, or region, of each solar cell, made in accordance with the teachings of this invention, is composed entirely of one type of conductivity. If electrical contact grids are employed on the surface of the cell exposed to the radiant source of energy, the total area of the surface covered by the grid should be no greater than 10 percent, and preferably no greater than 5 percent. The overall size of the interconnecting regions, exposed in the top surface of a solar cell should be as small as practical since they contribute less carrier generation potential than the balance of the regions comprising the solar cell. The greatest portion of the convoluted P-N junction is preferably substantially parallel to the surface exposed to the source of radiation when the solar cell configuration is as shown for solar cells 210, 310 and 410. Preferably, the solar cell configuration is that as shown for the FIGS. 3 through 8. Both regions of opposite type conductivity comprising the rear side of the solar cell must have sufficient area in order to make a good electrical contact thereto.

Referring now to FIG. 19, there is shown a solar cell 510 having three regions 512, 514 and 516 of N-type conductivity and two regions 218 and 220 of P-type conductivity. P-N junctions 522, 524, 526 and 528 are between respective regions 512 and 518, 518 and 514, 514 and 520, and 520 and 516. Opposed major surfaces 530 and 532 are, respectively, top and bottom surfaces of the cell 510.

The thickness of the regions, the material of each of the regions, and the electrical characteristics of each of the regions of the cell 510 are the same as described heretofore for the solar cells of this invention.

Rod-like regions 534 of P-type conductivity extend through the layer 514 to connect the regions 518 and 520 and P-type conductivity. The distribution of the region 534 is the same as described heretofore. As a result of the interconnection of the layers 518 and 520 into essentially one region of P-type conductivity, the P-N junctions 524 and 526 are joined together by P-N junctions 536 formed between the regions 534 and the region 514 into one convoluted P-N junction.

An electrical contact grid 538 is affixed to the top surface 530 thereby forming an electrical connection to the region 412. A layer 540 of electrically insulating material such, for example, as silicon oxide, silicon nitride, aluminum nitride and the like is disposed on an exposed end portion of each of the P-N junctions 524 and 526 and the adjacent surface area of the regions 518, 514 and 520. Electrically conductive metal is deposited as a layer 542 on the region 540 and the exposed surface of the region 514 therebetween to form an electrical connection to the region 514.

Electrical contacts 544 and 546 are affixed to the respective regions 516 and 520 in the same manner as described heretofore in describing the solar cell 410 and its electrical contacts 438 and 442 to the respective regions 14 and 16. Rod-like P-type regions 548 provide electrically conductive means from the contact 546 in the surface 532 to the layer 520. Electrical leads 550, 552 and 554 electrically connect all of the layers of N-type conductivity together via electrical lead 556 into an electrical circuit external to the cell 510. An electrical lead 558 electrically connects all the P-type regions into an electrical circuit external to the cell 510.

By means of the electrical connections shown in FIG. 19, all N-type regions are joined together and all P-type regions are joined together. P-N junctions 522 and 528 are connected in a parallel circuit relationship with each other. P-N junctions 524 and 526 are joined together as one convoluted P-N junction geometrically independent of the two P-N junctions but electrically connected in parallel with them by means of the leads.

We claim as our invention:

1. A solar cell comprising
   a body of semiconductor material having two opposed major surfaces substantially parallel to each other and a plurality of side surfaces;
   at least one of the surfaces having a preferred planar orientation which is one selected from the group consisting of <100>, <110> and <111>;
   the body having a lamellar structure of integral alternate first and second regions of opposite type conductivity and a selected level of resistivity, the material of the second regions comprising recrystallized semiconductor material of the body having solid solubility of a dopant material therein to impart thereto the type of conductivity and the level of resistivity;
   a plurality of first P-N junctions, each P-N junction being formed by the contiguous surfaces of each pair of mutually adjacent first and second regions and extending between and terminating in at least two opposed surfaces of the body;
   means for electrically connecting all layers of the same type conductivity semiconductor material together into an electrical circuit arrangement, and
   means for electrically connecting the regions of like conductivity into an electrical circuit external to the solar cell.
2. The solar cell of claim 1 in which:
   the distance between adjacent P-N junctions is less than approximately one diffusion length of a minority carrier generated within the solar cell.
3. The solar cell of claim 1 in which
   the P-N junctions are substantially perpendicular to the two opposed major surfaces and substantially parallel to each other, each first and second region having selected surface areas comprising respectively the top and bottom surfaces of the body and being oriented in a preferred wire direction for the particular surface planar orientation.
4. The solar cell of claim 3 in which
   the distance between adjacent P-N junctions is approximately one diffusion length of a minority carrier generated within the solar cell.
5. The solar cell of claim 4 including
   a first layer of semiconductor material having second type conductivity and a selected resistivity disposed on the bottom surface of the body substantially perpendicular to the plurality of a first and second regions, and
   a plurality of second P-N junctions, each of the second P-N junctions being formed by the contiguous surfaces of a first region of first type conductivity and the first layer of second type conductivity, each of the plurality of second P-N junctions being integral with at least one of the plurality of first P-N junctions.
6. The solar cell of claim 5 including
   a second layer of semiconductor material having first type conductivity and a selected resistivity disposed on the top surface of the body substantially perpendicular to the plurality of first and second regions, and substantially parallel to the first layer of second type conductivity;
   a plurality of third P-N junctions, each of the third P-N junctions being formed by the contiguous surfaces of a second region of second type conductivity and the second layer of first type conductivity, each of the plurality of third P-N junctions being integral with at least one of the plurality of first P-N junctions, and
   a convoluted P-N junction formed by the plurality of integral first, second and third P-N junctions.
7. The solar cell of claim 6 in which
   each of the first and second layer of semiconductor material has a thickness of from 0.3 to 0.5 micron.
8. The solar cell of claim 2 in which:
   the body of semiconductor material has two P-N junctions substantially parallel to each other and to the two major opposed surfaces and three alternate regions of conductivity, the first and the third regions being of first type conductivity and the second layer being of second type conductivity, a surface of each of the first and third regions comprising the two opposed major surfaces of the body.
9. The solar cell of claim 8 in which:
   the means for connecting the first and third regions together electrically comprises a first electrical contact electrically connected to one of the two major opposed surfaces and a second electrical contact electrically connected to the other of the two major opposed surfaces, the two electrical contacts being electrically connectable into an external electrical circuit.
10. The solar cell of claim 9 in which:
    a selective portion of the third region of the body of semiconductor material is removed to expose a selected surface area of the second region substantially parallel to the two major opposed surfaces; and the means for electrically connecting the second region into an electrical circuit external to the solar cell comprises an electrical contact disposed on the selected surface area of the second region and electrically connected to the second region.

11. The solar cell of claim 9 including:

at least one fourth region of semiconductor material having the same type conductivity as the second region disposed within and extending entirely through the third region from the second region the, at least one fourth region having a surface area exposed in, and comprising in part, the other of the two major opposed surfaces; and the means for electrically connecting the second layer into an electrical circuit external to the solar cell comprises an electrical contact disposed on at least the exposed surface area of the at least one fourth region of semiconductor material disposed within and extending entirely through the third layer.

12. The solar cell of claim 11 in which the material of each fourth region is recrystallized semiconductor material of at least the third region having solid solubility of a dopant material therein to impart second type conductivity and a preselected level of resistivity thereto.

13. The solar cell of claim 11 in which the material of each fifth region is recrystallized semiconductor material of the second region and at least one of the first and third regions having a dopant material therein to impart first type conductivity and a preselected level of resistivity thereto.

14. The solar cell of claim 8 in which:

the means for electrically connecting the first and the third region of first type conductivity together consists of a region of first type conductivity formed in the entire outer peripheral portion of, and extending entirely through, the second region to join together both physically and electrically the first and third region and enclosing the second region therein;

the means for electrically connecting the second region of second type conductivity into an electrical circuit external to the solar cell comprises at least one fourth region of second type conductivity formed within, and extending entirely through, at least one of the first and third regions from at least one of the two opposed major surfaces to the second region and an electrical contact electrically connected to at least one of the at least one region of second type conductivity, and the means for electrically connecting the first and the third regions of first type conductivity into an electrical circuit external to the solar cell comprises an electrical contact electrically connected to the opposed major surface to which the at least one region of second conductivity extends.

15. The solar cell of claim 14 in which:

the means for electrically connecting the first and the third regions of first type conductivity includes at least one fifth region of recrystallized semiconductor material having solid solubility of a dopant metal therein and extending entirely through the second region thereby electrically joining together the first and third regions.

16. The solar cell of claim 15 in which:

the means for electrically connecting together all layers of like conductivity type comprises at least one region of the same type conductivity as the layers being electrically joined together formed in an exposed peripheral surface of the body and extending the entire distance between the two opposed major surfaces of the body.

17. The solar cell of claim 2 in which:

the means for electrically connecting together all regions of like conductivity type comprises a plurality of regions of recrystallized semiconductor material having solid solubility of a metal therein to impart the same type conductivity as the regions being electrically joined together, each of the plurality of regions extending entirely through at least one region of opposite type conductivity semiconductor material to electrically connect at least two regions of like semiconductivity together.

18. The solar cell of claim 17 in which each region of semiconductor material having a major surface comprising substantially all of one of the two opposed major surfaces of the body has a first type conductivity;

the means for electrically connecting all regions of second type conductivity into an electrical circuit external to the solar cell comprises at least one region of second type conductivity formed within one of the two regions of first type conductivity having a surface comprising one of the two major opposed surfaces and extending through the at least one of the regions from one of the regions of second type conductivity to the one of the two major opposed surfaces where the at least one region has a surface exposed thereat thereby comprising in part a portion of the one of the two opposed major surfaces of the body, and an electrical contact electrically connected to the exposed surface of the at least one region of second type conductivity.

19. The solar cell of claim 18 in which:

the means for electrically connecting the layers of first type conductivity into an electrical circuit external to the solar cell comprises an electrical contact affixed to, and electrically connected to, the one of the two opposed major surfaces in which the at least one region of second type conductivity has a surface exposed thereat.

20. The solar cell of claim 19 in which:

an electrical contact is affixed to, and electrically connected to, the other of the two opposed major surfaces, the electrical contacts affixed to the two opposed major surfaces being electrically connected together.

21. The solar cell of claim 8 in which:

the first region of semiconductor material having a major surface comprising one of the two opposed major surfaces has a thickness of from 0.3 micron to 0.5 micron; and the third region of semiconductor material having a major surface comprising the other of the two opposed major surfaces has a thickness greater than the first region of semiconductor material and less than each of the remaining regions of semiconductor material of said body.

22. The solar cell of claim 21 in which:

the body has four P-N junctions, each of which is substantially parallel to the two opposed major surfaces thereby dividing the body into five alternate regions of first type and second type conductivity semiconductor material, the first and the third regions each having first type conductivity, a fifth region of first type conductivity disposed between and in abutting contact with the second and the fourth regions of second conductivity, the third region having an exposed side surface; the second region in a physically abutting contact relationship with the first region and the fourth region in a physically abutting contact relationship with the second region; and including:

a first electrical contact disposed on the major surface of, and electrically connected to, the first region;

a second electrical contact disposed on the major surface of, and electrically connected to, the second region;

a third electrical contact disposed on the exposed surface of, and electrically connected to, the third region;

at least one sixth region of second type conductivity disposed within and extending entirely through the third region to electrically interconnect the second and the fourth regions, thereby forming a convoluted P-N junction of two of the four P-N junctions;

at least one region of recrystallized semiconductor material having solid solubility of a metal therein to impart second type conductivity thereto disposed within and extending entirely through the second region from the fourth region to the other of the two opposed major surfaces, each of the at least one sixth region having a surface exposed therein;

a fourth electrical contact disposed on, and electrically connected to, each of the at least one sixth region of second type conductivity, the fourth electrical contact being electrically insulated from the second region and the second electrical contact; and the first, the second and the third electrical contacts are connected together electrically whereby the convoluted P-N junction and each of the remaining P-N junctions are connected into a parallel electrical circuit relationship.

23. The solar cell of claim 3 in which
the semiconductor material is silicon,
the conductivity of the first regions is N-type, and
the conductivity of the second regions is P-type.

24. The solar cell of claim 23 in which
the second regions have aluminum as a dopant impurity, the concentration of which is approximately $2 \times 10^{19}$ atoms per cubic centimeter.

25. The solar cell of claim 3 in which
at least one of the two major opposed surfaces has a preferred planar orientation of $< 100 >$, and
at least each of the second regions has a preferred wire direction which is one selected from the group consisting of $< 011 >$ and $< 0\bar{1}1 >$.

26. The solar cell of claim 25 in which
the semiconductor material of the body is silicon, and
the dopant material of the recrystallized second regions is aluminum.

27. The solar cell of claim 3 in which
at least one of the two major opposed surfaces has a preferred planar orientation of (100), and at least each of the second regions has a preferred wire direction of $< 1\bar{1}0 >$.

28. The solar cell of claim 27 in which
the semiconductor material of the body is silicon, and
the dopant material of the recrystallized second regions is aluminum.

29. The solar cell of claim 3 in which
at least one of the two major opposed surfaces has a preferred planar orientation of $< 111 >$.

30. The solar cell of claim 29 in which
the semiconductor material of the body is silicon, and
the dopant material of the recrystallized second regions is aluminum.

31. The solar cell of claim 29 in which
at least each of the second regions has a preferred wire direction which is one selected from the group consisting of $< 01\bar{1} >$, $< 10\bar{1} >$ and $< 1\bar{1}0 >$.

32. The solar cell of claim 29 in which
at least each of the second regions has a preferred wire direction which is one selected from the group consisting of $< 11\bar{2} >$, $< \bar{2}11 >$ and $< 1\bar{2}1 >$.

33. The solar cell of claim 6 including
a first ohmic electrical contact affixed to the first layer of semiconductor material, and
a plurality of second ohmic electrical contacts, each second contact being affixed to a selected surface area of each first region, and
means for electrically connecting the plurality of second ohmic electrical contacts into the electrical circuit arrangement.

34. The solar cell of claim 1 in which:
the body has at least two exposed lateral surfaces,
the means for electrically connecting all regions of first type conductivity comprises a first layer of an electrically insulating material disposed on the exposed portions of the P-N junctions at one portion of the lateral surfaces and all of the exposed regions of second type conductivity,
a first layer of an electrically conductive material disposed on the layer of electrically insulating material and all adjacent exposed surfaces of the layers of first type conductivity whereby to electrically connect the layers of first type conductivity,
a second layer of electrically insulating material disposed on the exposed portion of the P-N junctions at another portion of the lateral surfaces and exposed regions of the first type conductivity adjacent thereto, and
a second layer of electrically conductive material disposed over the second layer of electrically insulating material and any adjacent surface area of the last mentioned exposed regions of the body.

35. A method for making a solar cell comprising a lamellar structure of a plurality of integral regions of alternate and opposite type conductivity and a selective resistivity, the method comprising the process steps of:

a. selecting a body of semiconductor material having two opposed surfaces substantially parallel to each other, at least one of the surfaces having a preferred planar orientation which is one selected from the group consisting of $< 100 >$, $< 110 >$ and $< 111 >$;

b. etching selectively the at least one surface having a preferred planar orientation to form at least one depression in the etched surface;

c. vapor depositing a layer of substantially oxygen free metal in the depression, the metal comprising at least one dopant material to dope the semiconductor material of the body to a specific type conductivity and a selected level of resistivity;

d. heating the body and the vapor deposited metal to an elevated temperature to form a melt of the semiconductor material and the metal;

e. establishing a temperature gradient substantially along a preferred crystallographic axis of the body, the selectively etched surface being at the lower temperature, and f. migrating the melt of semiconductor material and metal through the body substantially aligned with the preferred crystallographic axis of the body from the selectively etched surface to the opposed surface to form a region of recrystallized semiconductor material of the body having solid solubility of at least the dopant material therein to impart a selected type conductivity and a selected level of resistivity thereto and a first P-N junction at the contiguous surfaces of each pair of regions of opposite type conductivity.

36. The process of claim 35 wherein
the semiconductor material of the body is silicon of N-type conductivity, and the dopant material of the substantially oxygen free metal is aluminum.

37. The method of claim 35 wherein
the at least one surface has a preferred planar orientation of (100), and
the preferred crystallographic axis of migration is $<100>$.

38. The method of claim 37 wherein
the at least one etched depression has a trough-like configuration which has a wire direction which is one selected from the group consisting of $<011>$ and $<0\bar{1}1>$.

39. The method of claim 35 wherein
the at least one surface has a preferred planar orientation of (110), and
the preferred crystallographic axis of migration is $<110>$.

40. The method of claim 39 wherein
the at least one etched depression has a trough-like configuration which has a $<01\bar{1}>$ wire direction.

41. The method of claim 35 wherein
the at least one surface has a preferred planar orientation of (111), and
the preferred crystallographic axis of migration is $<111>$.

42. The method of claim 35 wherein
the at least one etched depression has a trough-like configuration which has a wire direction which is one selected from the group consisting of $<01\bar{1}>$, $<10\bar{1}>$, $<1\bar{1}0>$, $<11\bar{2}>$, $<\bar{2}11>$ and $<1\bar{2}1>$.

43. The method of claim 35 and further wherein
the plurality of integral regions are substantially perpendicular to the opposed surfaces, and further including the process steps of
forming a region of first type conductivity and a selected level of resistivity on the at least one surface having a preferred planar orientation, and a
second P-N junction at the contiguous surfaces of each pair of regions of opposite type conductivity, each second P-N junction being integral with at least one first P-N junction, and
forming a region of second type conductivity and a selected level of resistivity on the other of the two opposed surfaces and a third P-N junction at the contiguous surfaces of each pair of regions of opposite type conductivity, each third P-N junction being integral with at least one first P-N junction, whereby
said first, said second and said third P-N junctions form a single convoluted P-N junction within the solar cell.

44. The process of claim 43 wherein
the semiconductor material of the body is silicon of N-type conductivity, and
the dopant material of the substantially oxygen free metal is aluminum.

* * * * *